US009773702B2

United States Patent
Gong et al.

(10) Patent No.: US 9,773,702 B2
(45) Date of Patent: Sep. 26, 2017

(54) DEVICE WITHOUT ZERO MARK LAYER

(71) Applicant: GLOBALFOUNDRIES Singapore Pte. Ltd., Singapore (SG)

(72) Inventors: Shunqiang Gong, Singapore (SG); Juan Boon Tan, Singapore (SG); Shijie Wang, Singapore (SG); Mahesh Bhatkar, Singapore (SG); Daxiang Wang, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 14/981,873

(22) Filed: Dec. 28, 2015

(65) Prior Publication Data

US 2016/0190041 A1    Jun. 30, 2016

(51) Int. Cl.
*H01L 21/4763* (2006.01)
*H01L 21/768* (2006.01)
(Continued)

(52) U.S. Cl.
CPC ...... *H01L 21/76898* (2013.01); *H01L 23/544* (2013.01); *H01L 23/525* (2013.01);
(Continued)

(58) Field of Classification Search
CPC ......... H01L 2924/0002; H01L 2924/00; H01L 21/76831; H01L 21/76877;
(Continued)

(56) References Cited

U.S. PATENT DOCUMENTS 6,700,175 B1 * 3/2004 Kodama ............ H01L 29/0634
                                                     257/302
8,546,961 B2    10/2013 Farooq et al.
(Continued)

FOREIGN PATENT DOCUMENTS

CN            103633067 A      3/2014

OTHER PUBLICATIONS

Notice of Eligibility for Grant and Examination Report of Singapore Patent Application 10201408768X mailed on Nov. 9, 2015.

*Primary Examiner* — Duy T Nguyen
(74) *Attorney, Agent, or Firm* — Horizon IP Pte. Ltd.

(57) ABSTRACT

Devices and methods for forming a device are disclosed. The method includes providing a substrate having first and second surfaces. At least one through silicon via (TSV) opening is formed in the substrate. The TSV opening extends through the first and second surfaces of the substrate. An alignment trench corresponding to an alignment mark is formed in the substrate. The alignment trench extends from the first surface of the substrate to a depth shallower than a depth of the TSV opening. A dielectric liner layer is provided over the substrate. The dielectric liner layer at least lines sidewalls of the TSV opening. A conductive layer is provided over the substrate. The conductive layer fills at least the TSV opening to form TSV contact. A redistribution layer (RDL) is formed over the substrate. The RDL layer is patterned using a reticle to form at least one opening which corresponds to a TSV contact pad. The reticle is aligned using the alignment mark in the substrate.

25 Claims, 20 Drawing Sheets

(51) Int. Cl.
*H01L 23/544* (2006.01)
*H01L 23/525* (2006.01)

(52) U.S. Cl.
CPC ............ *H01L 2223/5442* (2013.01); *H01L 2223/54426* (2013.01); *H01L 2223/54453* (2013.01); *H01L 2924/0002* (2013.01)

(58) Field of Classification Search
CPC ....... H01L 21/76898; H01L 2223/5442; H01L 2223/54426; H01L 2223/54453; H01L 23/481; H01L 23/525; H01L 23/544
See application file for complete search history.

(56) References Cited

U.S. PATENT DOCUMENTS

| | | |
|---|---|---|
| 8,563,403 B1 | 10/2013 | Farooq et al. |
| 2005/0161837 A1 | 7/2005 | Matsui |
| 2005/0260852 A1* | 11/2005 | Ip ........................ H01L 28/40 438/669 |
| 2010/0089748 A1* | 4/2010 | C.Forster ............ C23C 14/3407 204/298.16 |
| 2011/0003476 A1* | 1/2011 | Yun ...................... H01L 21/288 438/675 |
| 2011/0024916 A1 | 2/2011 | Marimuthu et al. |
| 2011/0266691 A1* | 11/2011 | Lin .................. H01L 21/76816 257/774 |
| 2012/0056315 A1 | 3/2012 | Chang et al. |
| 2012/0175789 A1 | 7/2012 | Farooq et al. |
| 2014/0147984 A1 | 5/2014 | Zhang |

* cited by examiner

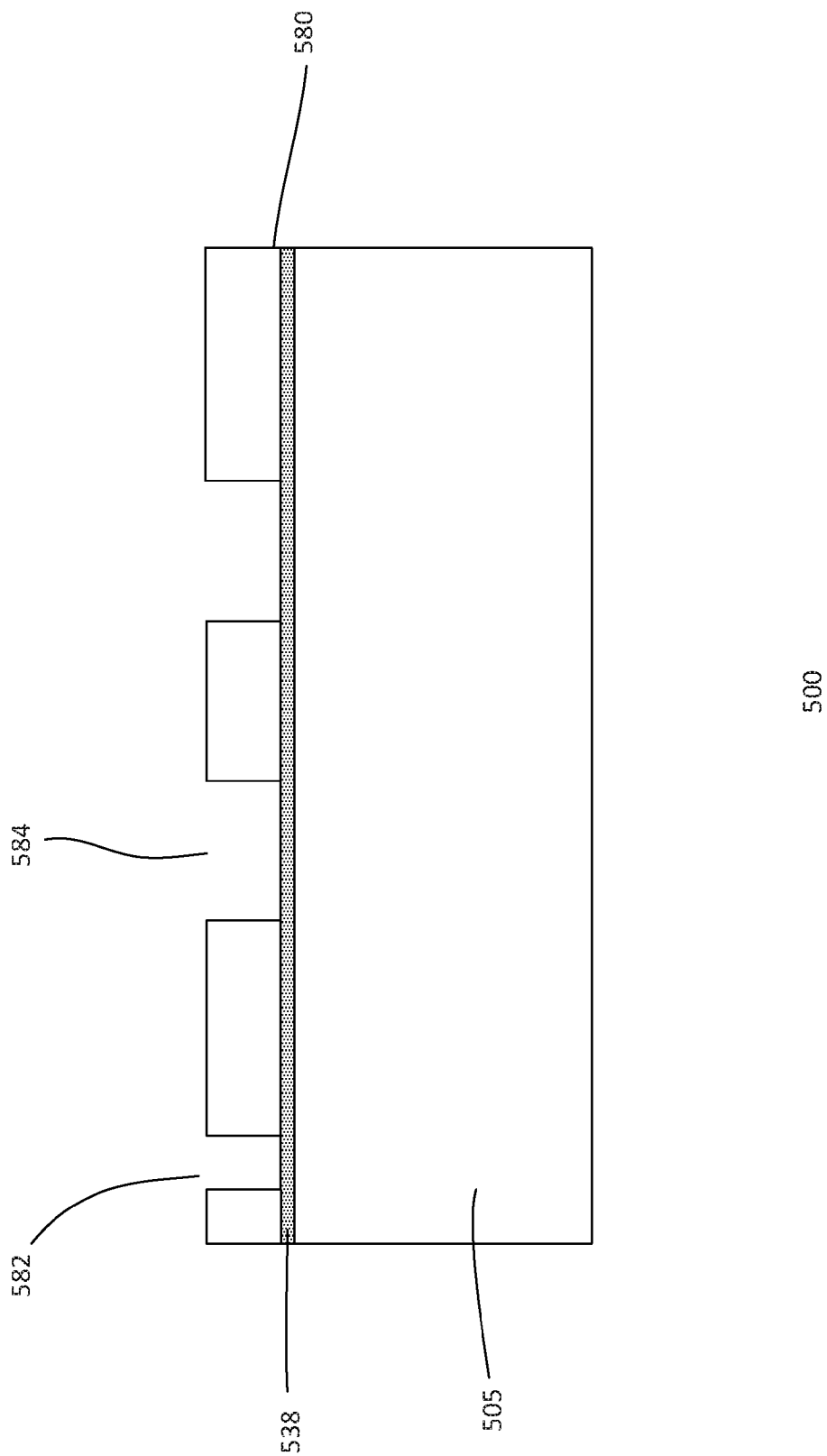

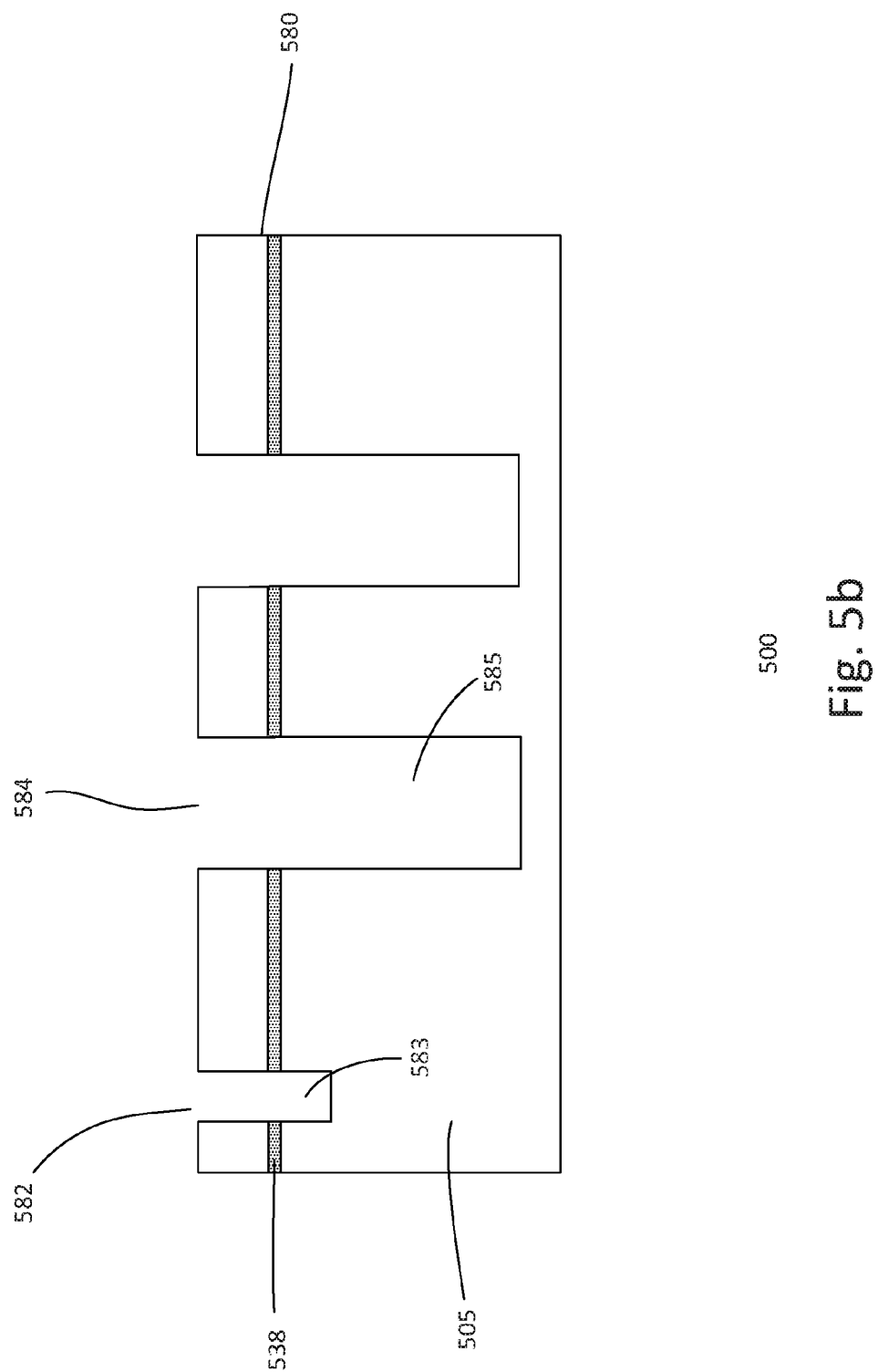

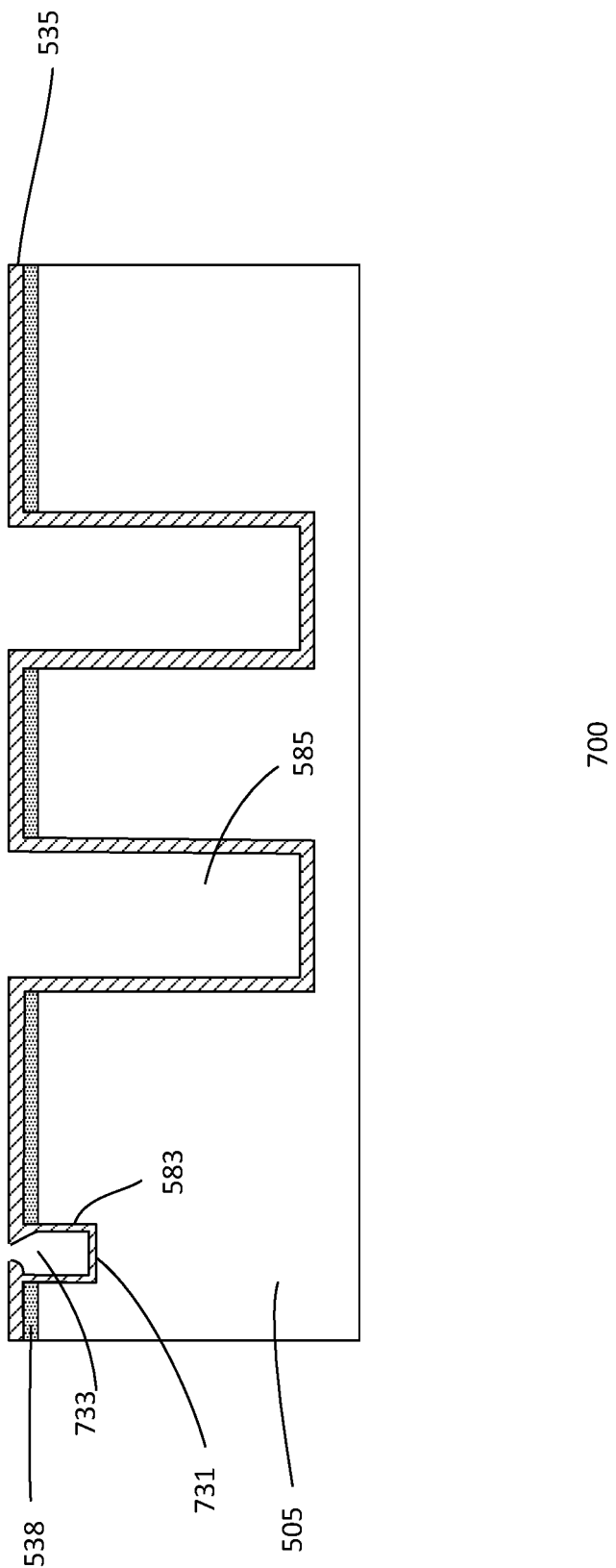

DEVICE WITHOUT ZERO MARK LAYER

CROSS-REFERENCE TO RELATED APPLICATION

This application claims priority to Singapore Patent Application No. 10201408768X, filed on Dec. 29, 2014, which is herein incorporated by reference in its entirety for all purposes.

BACKGROUND

Through vertical interconnect access (via) is a vertical electrical connection passing completely through a silicon wafer or interposer. Through-silicon via (TSV) contact demonstrates a high performance technique used to create smaller packages and integrated circuits. This technique improves physical scaling limitations while delivering greater performance and functionality. Redistribution layer (RDL) or conductive lines disposed over the silicon wafer or interposer require alignment with underlying TSV contacts. Conventional manufacturing process employs an extra zero-mark layer to assist in the alignment of the conductive lines and underlying TSV contacts. However, conventional processes may result in reliability issues, such as wafer dicing crack concern, and increases the manufacturing costs.

From the foregoing discussion, it is desirable to provide simplified, cost efficient and improved techniques for alignment of RDL or conductive lines with underlying TSV contacts.

SUMMARY

Embodiments generally relate to semiconductor devices and methods of forming a semiconductor device.

In one embodiment, a device is disclosed. The device includes a substrate having first and second surfaces. The substrate is defined with a device region and a frame region surrounding the device region. At least one through silicon via (TSV) opening is disposed in the substrate. The TSV opening extends through the first and second surfaces of the substrate and is lined with a dielectric liner layer and filled with a conductive material to form TSV contact. An alignment trench is disposed in the substrate. The alignment trench extends from the first surface of the substrate to a depth shallower than a depth of the TSV contact. A redistribution layer (RDL) is disposed over the substrate. The RDL includes TSV contact pad coupled to the TSV contact.

In another embodiment, a method for forming a device is disclosed. The method includes providing a substrate having first and second surfaces. The substrate is defined with a device region and a frame region surrounding the device region. At least one through silicon via (TSV) opening is formed in the substrate. The TSV opening extends through the first and second surfaces of the substrate. An alignment trench corresponding to an alignment mark is formed in the substrate. The alignment trench extends from the first surface of the substrate to a depth shallower than a depth of the TSV opening. A dielectric liner layer is provided over the substrate. The dielectric liner layer at least lines sidewalls of the TSV opening. A conductive layer is provided over the substrate. The conductive layer fills at least the TSV opening to form TSV contact. A redistribution layer (RDL) is formed over the substrate. The RDL layer is patterned using a reticle to form at least one opening which corresponds to a TSV contact pad. The reticle is aligned using the alignment mark in the substrate.

In yet another embodiment, a method for forming a device is presented. The method includes providing a substrate having first and second surfaces. The substrate is defined with a device region and a frame region surrounding the device region. At least one through silicon via (TSV) opening and an alignment trench corresponding to an alignment mark are formed in the substrate. The alignment trench extends from the first surface of the substrate to a depth shallower than a depth of the TSV opening. A dielectric liner layer is formed over the substrate. The dielectric liner layer at least lines sidewalls of the TSV opening and sidewalls of the alignment trench. A conductive layer is provided over the substrate. The conductive layer fills at least the TSV opening to form TSV contact.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the disclosure. In the following description, various embodiments of the present disclosure are described with reference to the following drawings, in which:

FIGS. 5a-5h show cross-sectional views of an embodiment of a process for forming a device;

FIGS. 7a-7b show cross-sectional views of yet another embodiment of a process for forming a device.

DETAILED DESCRIPTION

Embodiments generally relate to semiconductor devices. More particularly, embodiments relate to semiconductor wafers with through silicon via (TSV) contacts. The TSV contacts may be used in packaging one or more devices, such as integrated circuits (ICs) to form 2.5D or 3D packages. For example, an interposer wafer with TSV contacts may facilitate in forming 2.5D packages including system-on-chip (SoC) devices while active wafer with TSV contacts may facilitate in forming 3D packages. The devices can be incorporated into, for example, consumer electronic products, such as computers, cell phones, and personal digital assistants (PDAs). Incorporating the devices in other applications may also be useful.

Figure 1:
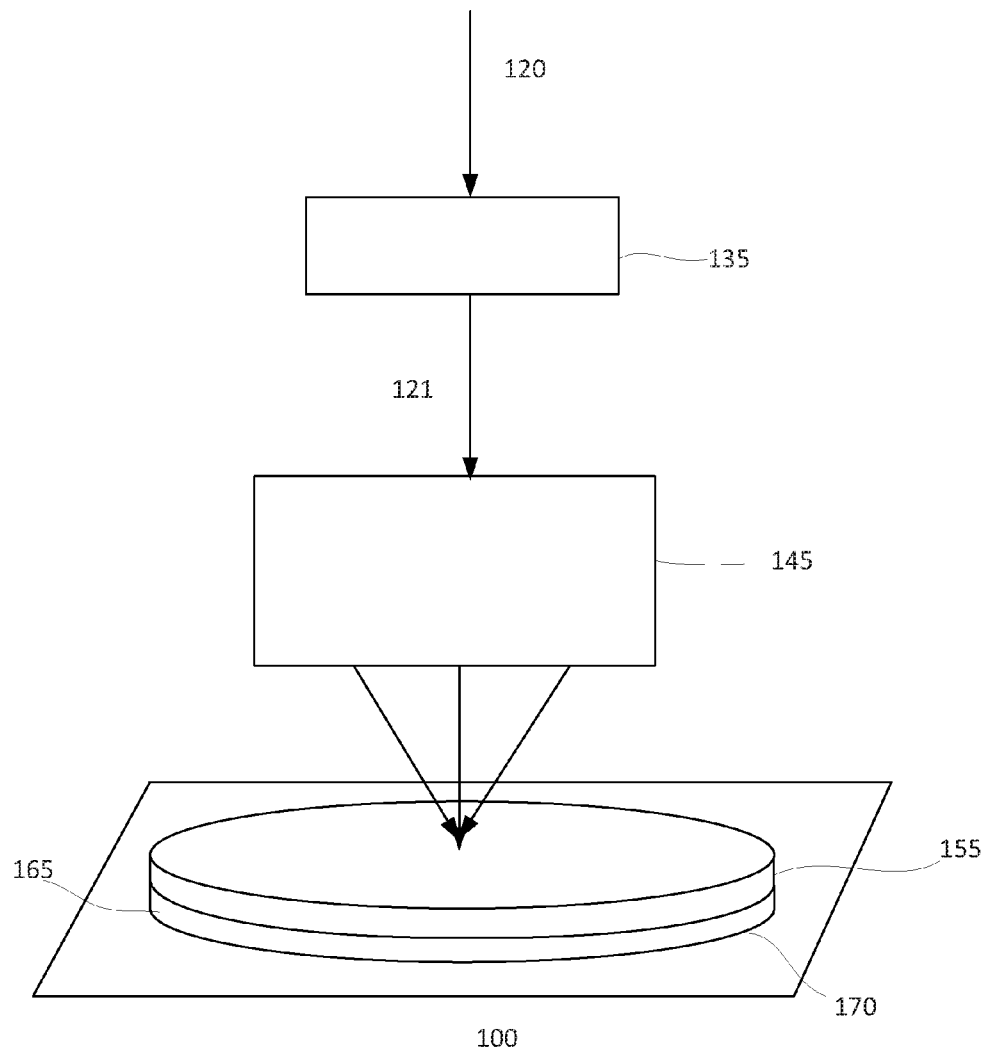
FIG. 1 shows a simplified diagram of a portion of an exemplary lithographic system.

FIG. 1 shows a simplified portion of an exemplary photolithography system 100 used for patterning a wafer to form features, such as circuit components. The photolithography system may include, for example, exposure, beam shaping and illumination sub-systems (not shown). The exposure sub-system, for example, includes an exposure source for generating electromagnetic radiation (EMR). In one embodiment, the EMR is used in extreme ultra-violet (EUV) lithography. The EMR is passed through the beam shaping sub-system, which may include a collimator and monochromator to prepare an EMR beam (e.g., EMR operating beam). The EMR operating beam is passed through the illumination sub-system. The illumination sub-system, for example, may include mirrors and/or lenses. The illumination sub-system conducts the EMR operating beam 120 to a mask or reticle 135 having a desired pattern (e.g., mask pattern).

In one embodiment, the reticle is a transmissive reticle. For example, the reticle transmits the EMR operating beam through it. The transmitted EMR beam 121 is a patterned beam having the pattern of the reticle. Other types of reticles, such as reflective reticles, can also be employed. For example, the reflective reticle reflects the EMR operating beam, creating a reflected patterned beam.

The patterned beam is projected onto the wafer 165. In one embodiment, the wafer is disposed on a translation stage 170. In one embodiment, the patterned beam is projected onto the wafer by a projection sub-system 145. The projection sub-system may include mirrors and/or lenses for projecting the patterned beam onto a portion of the wafer. The wafer includes a photoresist layer 155 which is exposed by the patterned beam. For example, the image of the patterned beam is imaged onto the photoresist layer. The patterned beam exposes a portion of the wafer with the image of the reticle. The exposed portion corresponds to a device region on which a device is formed. After exposing the portion, the stage may be translated to expose a next portion of the wafer. The exposure process repeats until the complete wafer is exposed. Processing a wafer using other types of lithographic or printing systems may also be useful.

After the wafer has been exposed, the photoresist is developed, transferring the pattern of the reticle to the resist layer. An anti-reflective coating (ARC) may be provided beneath the resist layer to improve lithographic resolution. The patterned resist layer serves as an etch mask. For example, an anisotropic etch, such as a reactive ion etch (RIE), patterns the wafer using the etch mask. Depending on the stage of process, the etch may etch a bare wafer, a layer on the wafer, or multiple layers on the wafer. In the fabrication of devices, such as interposers, several patterning processes utilizing different reticles may be performed.

After processing of the wafer is completed, the wafer is diced along the dicing channel (or kerf) to produce individual dies or interposers. The dies or interposers may be processed to include package bumps. For example, wafer level packaging may be performed prior to dicing the wafer. The finished interposers may be processed to mount ICs thereon. The interposer with the ICs may be mounted onto an external component, such as a package substrate or a circuit board.

Figure 2:
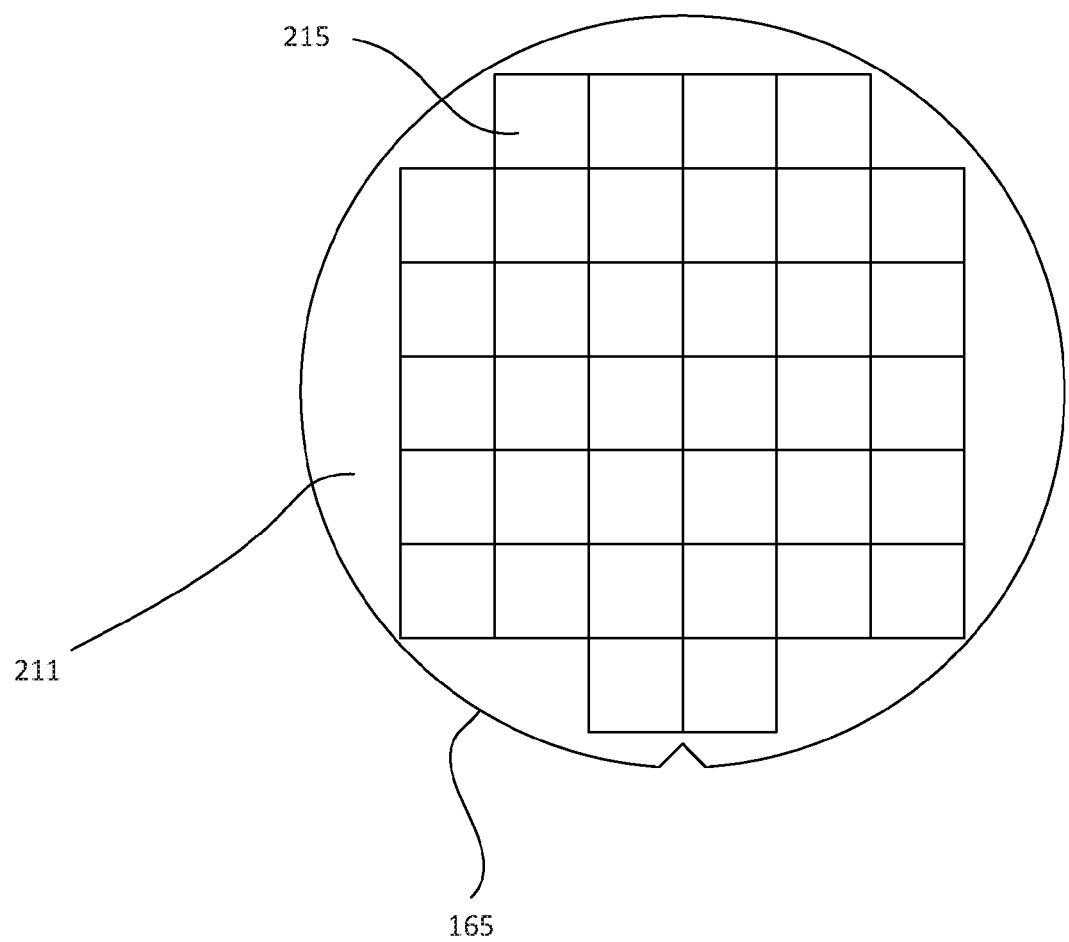
FIG. 2 shows a simplified plan view of a portion of an embodiment of a semiconductor wafer.

FIG. 2 shows a simplified plan view of a portion of an embodiment of a semiconductor wafer 165. The semiconductor wafer, for example, may be a silicon wafer. Other types of wafers are also useful. For example, the wafer may be a p-type or n-type doped wafer.

The wafer includes a surface 211 on which a plurality of devices 215 are formed. The plurality of devices may be formed on the wafer in parallel. The devices, for example, are arranged in rows along a first (x) direction and columns along a second (y) direction. A device, as shown, includes a main device region and a frame or perimeter region. The main device region includes features and interconnections of the die or interposer. As for the perimeter region, it surrounds the main device region. The perimeter region, for example, serves as dicing channels on the wafer, separating adjacent devices. The devices are singulated by dicing the wafer along the dicing channels.

Figure 3:
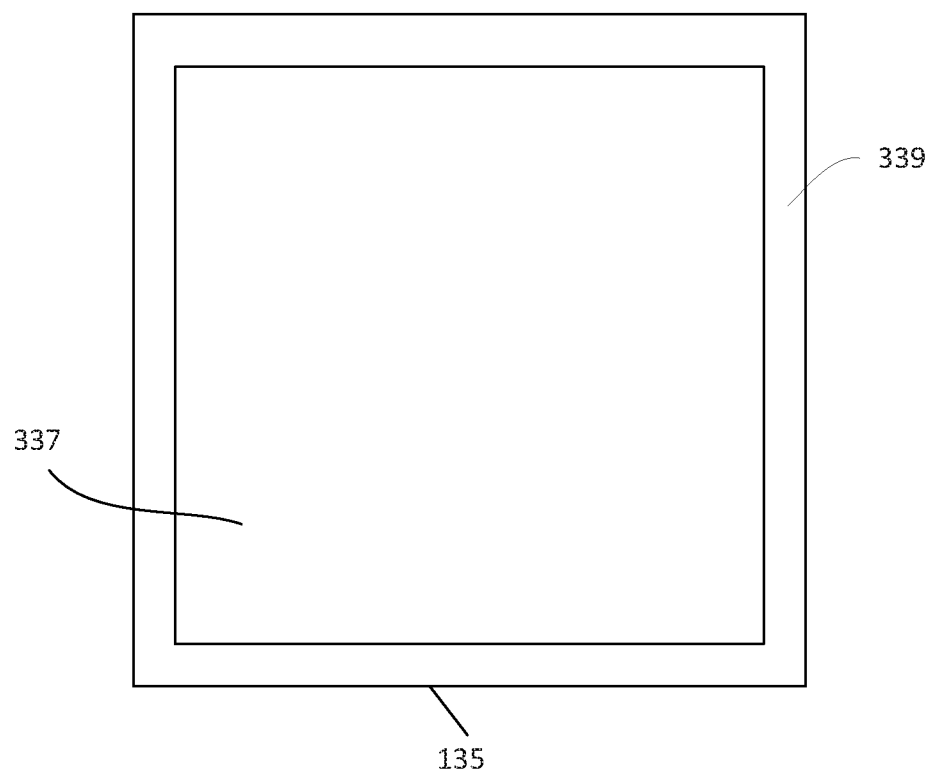
FIG. 3 shows a simplified plan view of an embodiment of a reticle used in exposing a wafer.

FIG. 3 shows an embodiment of a reticle 135 used in exposing a wafer. As shown, the reticle includes a prime or main region 337. The main region, for example, may be referred to as the device region. The device region includes a pattern which, for example, corresponds to the pattern to be formed in the device. The reticle creates patterns of devices in the main device regions on the wafer. A frame region 339 surrounds the device region. The frame region, for example, corresponds to perimeter regions or dicing channels on the wafer. The frame region surrounds the devices on the wafer. The reticle is used to create desired patterns for respective levels on the device. In forming the dies or interposers, several reticles may be employed.

Figure 4A:
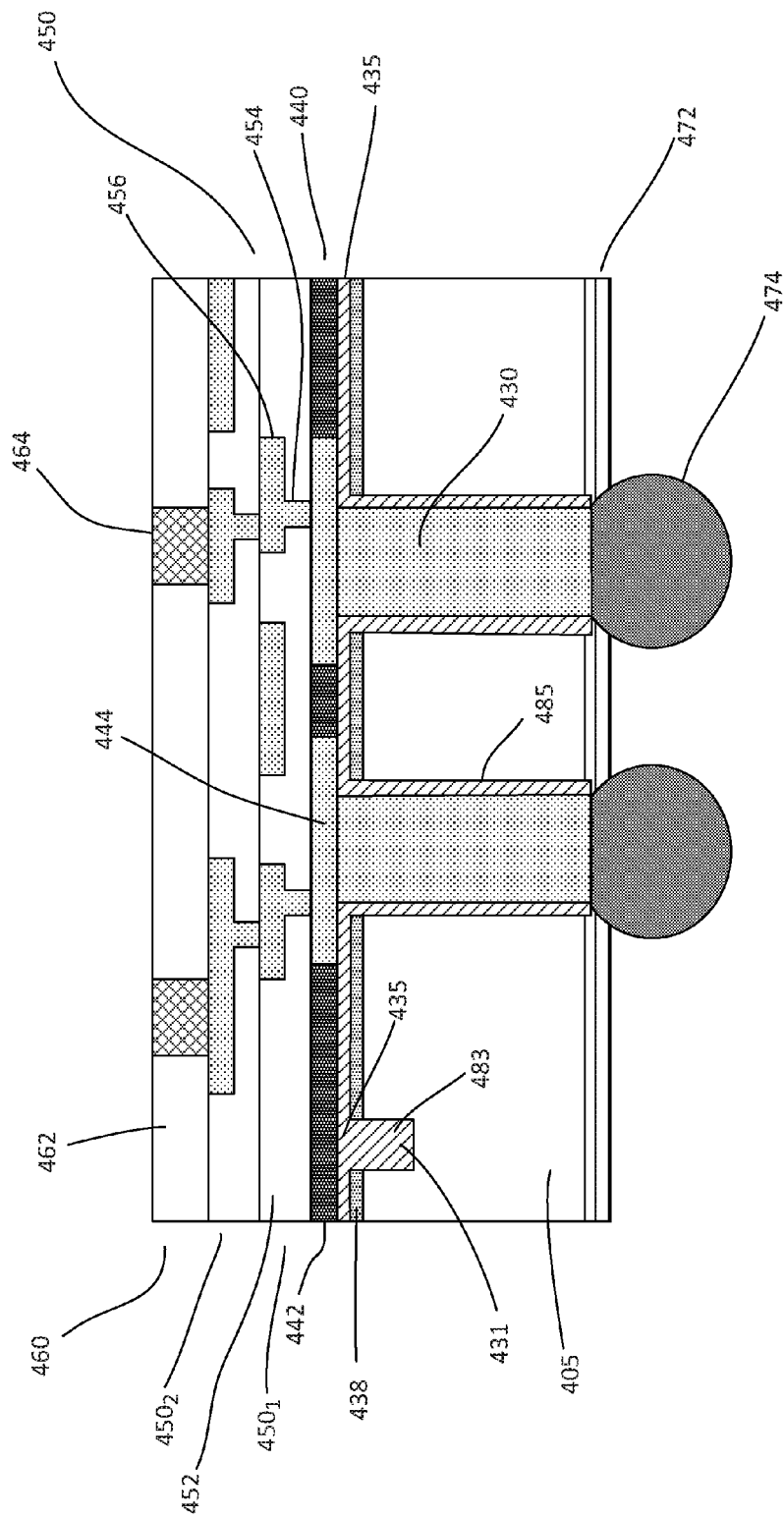
FIGS. 4a-4c show cross-sectional views of various embodiments of a device.
Figure 4B:
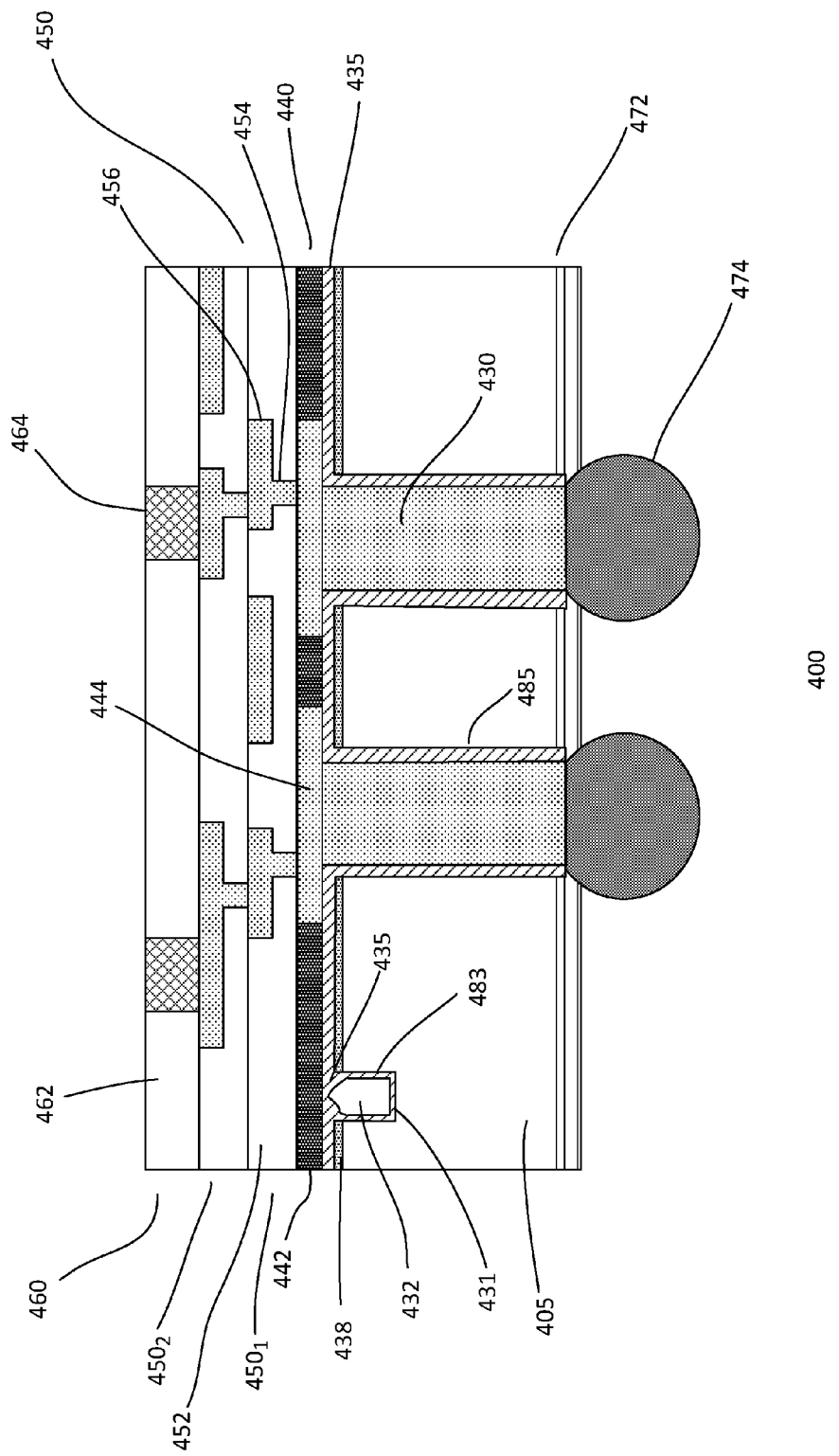
Figure 4C:
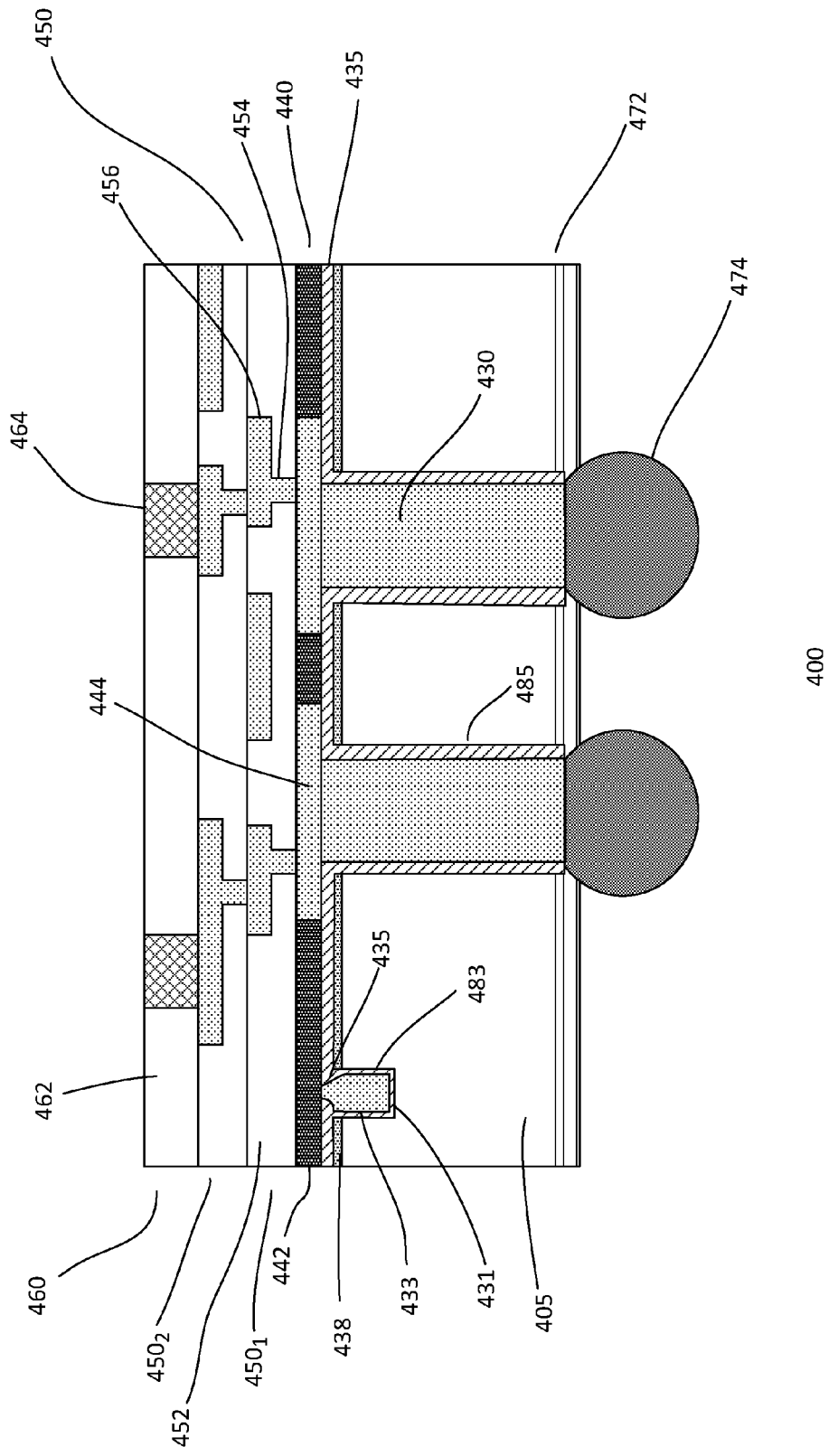

FIGS. 4a-4c show cross-sectional views of various embodiments of a portion of a device 400. In one embodiment, the device is an interposer. In an alternate embodiment, the device is an active device. The device includes a substrate 405. The substrate, for example, may be a silicon substrate. Other types of substrates, such as silicon germanium, germanium, gallium arsenide, or crystal-on-insulator (COI) such as silicon-on-insulator (SOI), are also useful. The substrate may be a doped substrate. The substrate can be lightly doped with p-type dopants. For example, the substrate may be silicon substrate, intrinsic or doped with other types of dopants or dopant concentrations. The substrate may be a part of a wafer which is processed in parallel to form a plurality of devices.

The substrate includes first and second surfaces. The first surface may be the top surface on which an IC is mounted while the second surface is the bottom surface which is mounted onto, for example, an external component, such as a package substrate or a circuit board. In one embodiment, the substrate includes TSV contacts 430. The TSV contacts extend through the first and second surfaces of the substrate. The TSV contacts are, for example, copper TSV contacts. Other suitable types of conductive materials for the TSV contacts may also be useful. To provide electrical isolation from the substrate, the TSV contacts may be lined with a dielectric liner 435. The TSV contacts and liners are disposed in TSV trenches 485. A back-grinding process may be performed on backside of the substrate to expose the bottom of the TSV contacts, creating through holes.

In one embodiment, the substrate includes an alignment mark 431. The alignment mark, for example, may be disposed in the frame region which surrounds the device region of the substrate. Alternatively, the alignment mark may be disposed in the device region of the substrate. In one embodiment, the alignment mark 431 is a trench 483 filled with dielectric liner material, as shown in FIG. 4a. In another embodiment, the alignment mark may include a closed-off void 432 within the dielectric liner material, as shown in FIG. 4b. For example, as shown in FIG. 4b, the dielectric liner material partially fills the trench 483 resulting in a closed-off void 432 within the dielectric liner material. In one embodiment, the width of the alignment trench 483 is less than about 2 times (2×) the thickness of the liner layer. This allows the trench to be filled with liner material or pinches off to prevent conductive material from being disposed therein. In such cases, the alignment mark is devoid of conductive material, such as that of the TSV contacts. In yet another embodiment, the alignment trench 483 may be lined with the dielectric liner material and a void 433 remaining in the alignment trench may be at least partially filled with conductive material of the TSV contacts, as shown in FIG. 4c. In this case, the alignment mark 431 includes conductive material within the dielectric liner material. As shown, the dielectric liner material lining the sidewalls of the alignment trench isolates the conductive material from the substrate material.

Although the alignment mark includes one trench, it is understood that an alignment mark may include numerous trenches. Other suitable configurations of alignment marks may also be useful.

As shown, the dielectric liner layer lines also the surface of the substrate. In one embodiment, a top surface of the TSV contacts is about coplanar with a top surface of the dielectric liner layer 435. A hard mask layer 438 may optionally be disposed on the surface of the substrate. The hard mask layer is used to pattern the substrate to form the TSV trenches and alignment mark trench. The hard mask may be a silicon nitride hard mask. In one embodiment, the hard mask may include a hard mask stack. For example, the hard mask may include a pad oxide on the substrate and a silicon nitride layer. Other suitable configurations of hard mask or hard mask stacks may also be useful.

The first surface of the substrate includes a redistribution layer (RDL). In one embodiment, the RDL includes a bottom RDL level 440 and an upper RDL level 450. The bottom RDL level is disposed over the dielectric liner layer 435 and TSV contacts 430. In one embodiment, the bottom RDL level may include a silicon oxide layer 442. Other suitable types of dielectric layers may also be useful. The bottom RDL level includes TSV contact pads 444. The TSV contact pads may be conductive islands or conductive lines. The TSV contact pads 444 are coupled to the TSV contacts 430. The TSV contact pads may be copper TSV contact pads. Other suitable types of conductive contact pads may also be useful.

As shown, the upper RDL level includes first and second upper RDL levels $450_1$-$450_2$. An upper RDL level includes a RDL dielectric layer 452 with interconnects having contacts 454 in a RDL via level and conductive lines 456 in a RDL line level. The contacts and lines are, for example, copper contacts and lines formed by dual damascene technique. Other suitable techniques for forming the interconnects, such as the copper contacts and lines, or configurations of RDL levels may also be useful.

A pad level 460 is disposed over the RDL. For example, the pad level is disposed over the second or top of the upper RDL level. The pad level includes contact pads 464 disposed in a pad dielectric layer 462. The contact pads, for example, are aluminum contact pads. Other suitable types of contact pads may also be useful. The contact pads provide a basis of electrical connection for connecting to an IC which is mounted onto the interposer.

As for the second substrate surface, it includes conductive bumps or conductive contacts 474. Where the substrate is an interposer substrate, the conductive contacts may be referred to as interposer contacts. As shown, the conductive contacts 474 are coupled to the TSV contacts 430. The conductive contacts 474, for example, include solder balls. Other suitable types of conductive contacts may also be useful. A dielectric layer 472 may be provided on the surface of the second substrate surface. The dielectric layer, for example, includes openings exposing the bottom of the TSV contacts and facilitates in the formation of the conductive contacts. The dielectric layer is used as an insulation to prevent shorting between adjacent conductive contacts.

Figure 4D:
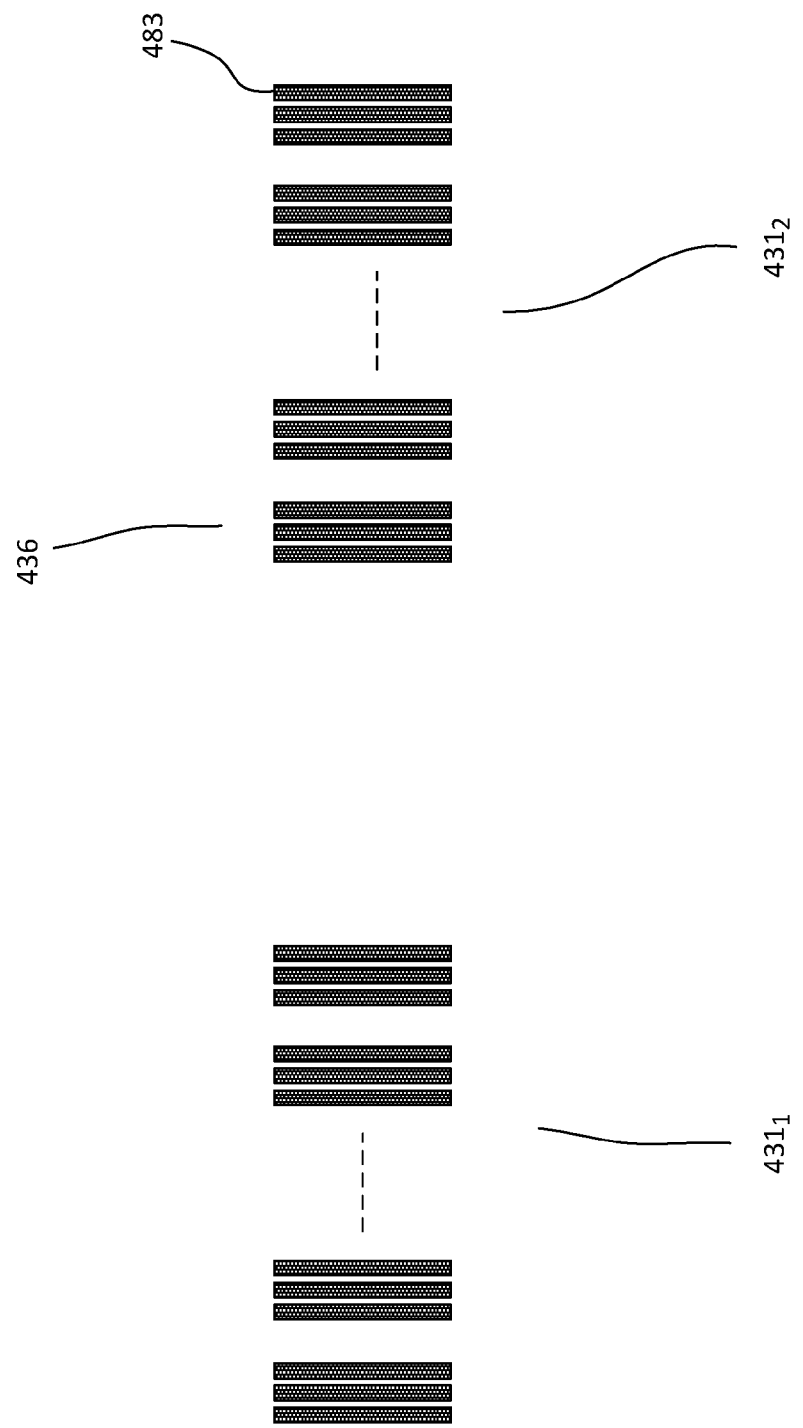
FIG. 4d shows an exemplary embodiment of an alignment mark.

FIG. 4d shows an embodiment of an alignment mark 431. As shown, the alignment mark includes first and second groups $431_1$-$431_2$ of alignment marks. The first and second groups are spaced apart from each other. A group includes subgroups of alignment marks 436. For example, a group may include 8 equally spaced apart subgroups. Providing a group with other number of subgroups may also be useful. In one embodiment, a subgroup includes three elongated equally spaced trenches 483 filled with dielectric material of the TSV dielectric liner. In another embodiment, a subgroup includes three elongated equally spaced apart filled trenches having a closed-off void in the dielectric material of the TSV liner. In yet another embodiment, a subgroup includes three elongated equally spaced apart alignment trenches with a void partially filled with conductive material of TSV contact within the dielectric material of the TSV liner. In one embodiment, the spacing of the groups is greater than the spacing of the subgroups, which is greater than the spacing between trenches within a subgroup. Other suitable configurations of subgroups may also be useful.

FIGS. 5a-5h show cross-sectional views of an embodiment of a process 500 for forming a device. In one embodiment, the process forms an interposer with TSV contacts. As shown, a substrate 505 is provided. The substrate, for example, may be a silicon substrate. Other suitable types of substrates, such as silicon germanium, germanium, gallium arsenide, or crystal-on-insulator (COI) such as silicon-on-insulator (SOI), are also useful. The substrate may be a doped substrate. The substrate can be lightly doped with p-type dopants. For example, the substrate may be silicon substrate, intrinsic or doped with other types of dopants or dopant concentrations. The substrate may be a part of a wafer which is processed in parallel to form a plurality of devices. The substrate includes first and second surfaces. The first surface may be the top surface on which an IC is mounted while the second surface is the bottom surface which is mounted onto an external component, for example, a package substrate or a circuit board.

A hard mask layer 538 is formed on the top surface of the substrate. The hard mask layer is used to pattern the substrate. The hard mask may be a silicon nitride hard mask. In one embodiment, the hard mask may be a hard mask stack. For example, the hard mask may include a pad oxide on the substrate and a silicon nitride layer over it. The pad oxide, for example, is formed by thermal oxidation while the nitride layer is formed by chemical vapor deposition (CVD). Other suitable configurations of hard mask or hard mask stacks may also be useful.

A soft mask layer 580 is formed on the hard mask. The soft mask layer, in one embodiment, is a photoresist layer. The soft mask is patterned to form first and second openings 582 and 584. The first opening corresponds to an alignment mark and the second openings correspond to TSV contacts. Although a single opening is shown corresponding to an alignment mark, the alignment mark may include a plurality of groups and subgroup of alignment marks, as described in FIG. 4d. Furthermore, although the portion only shows two openings corresponding to TSV contacts, it is understood that a device may include other number of or many more openings for TSV contacts.

To form the openings in the mask layer, it may be selectively exposed with an exposure source using a reticle. The pattern of the reticle is transferred to the resist layer after exposure by a development process. In one embodiment, the width of the trench opening corresponding to the alignment mark is less than 2× the thickness of a subsequently formed dielectric or isolation liner for the TSV contacts. For example, for a dielectric liner having a thickness of about 10-5000 nm, the alignment trench width may be about 0.1-50 µm. Other suitable widths for the alignment trench which is less than 2× the thickness of a subsequently formed dielectric liner may also be useful.

In FIG. 5b, an etch is performed on the substrate. The etch, in one embodiment, is an anisotropic etch, such as a RIE, using the patterned resist layer as an etch mask. The etch forms blind vias or TSV vias 585 and an alignment trench 583. The depth of the TSV vias 585 is deeper than a final or desired thickness of the substrate. For example, a back-grinding process is performed on the backside of the substrate to produce the desired thickness. This ensures that the subsequently formed TSV contacts extend through the top and bottom surfaces of the final substrate.

In one embodiment, due to the different widths of the TSV openings and alignment trench, the resulting depths are different. In one embodiment, the depth of the alignment trench is shallower than a depth of the TSV contacts. The widths of the alignment trench and TSV vias may be designed to produce the desired depths for the TSV vias and alignment trench. Due to TSV etch bias, the width of the alignment trench on the mask may not be the same as the actual width of the alignment trench which is formed in the substrate by the etch process. After forming the alignment trench and TSV vias, the resist mask 580 is removed by, for example, ashing. Other suitable techniques may also be used to remove the resist mask. As shown, the hard mask 538 remains after the removal of the resist mask. Alternatively, the hard mask may be removed after the removal of the resist mask, depending on process integration.

Figure 5C:
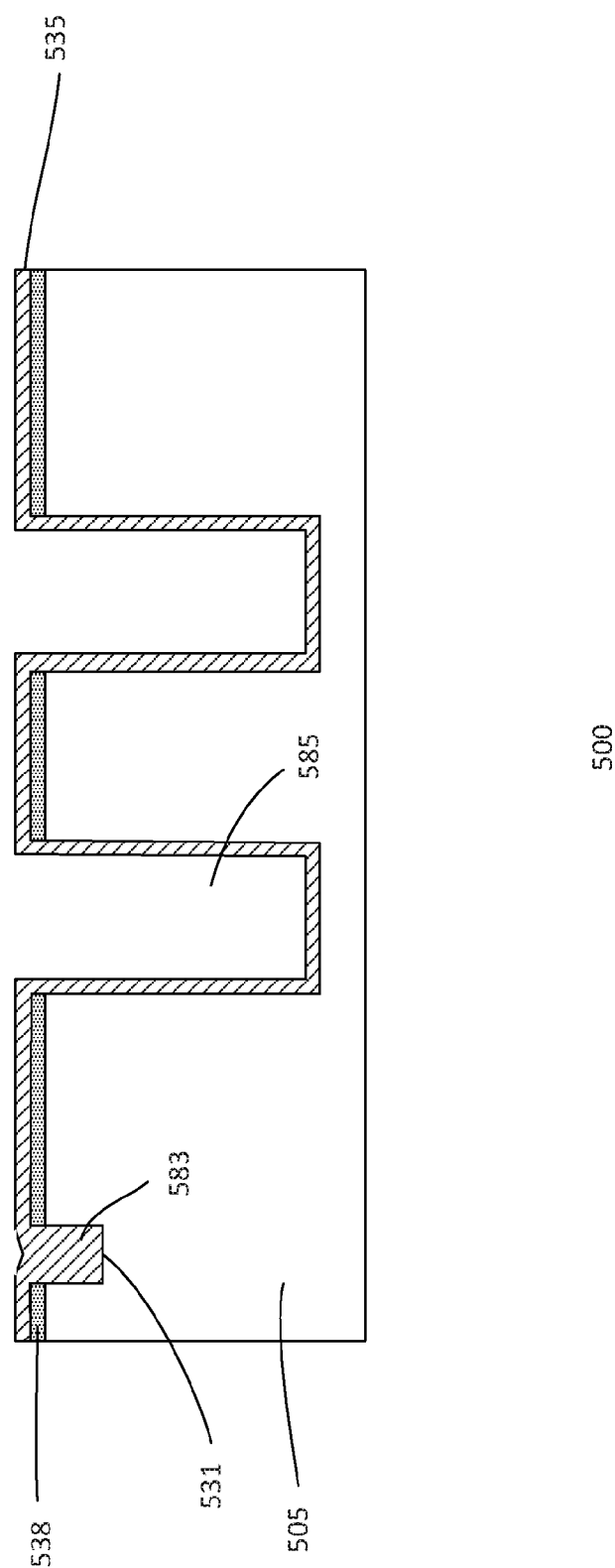

As shown in FIG. 5c, a dielectric liner 535 is formed on the substrate. In one embodiment, the dielectric liner lines the TSV vias and surface of the substrate (hard mask layer) as well as filling the alignment trench to form the alignment mark 531. The thickness of the liner should be sufficient to provide isolation for the TSV contacts and to fill the alignment trench. The dielectric liner, for example, is a silicon oxide liner formed by, for example, CVD. Other suitable dielectric materials and forming techniques may also be employed.

Figure 5D:
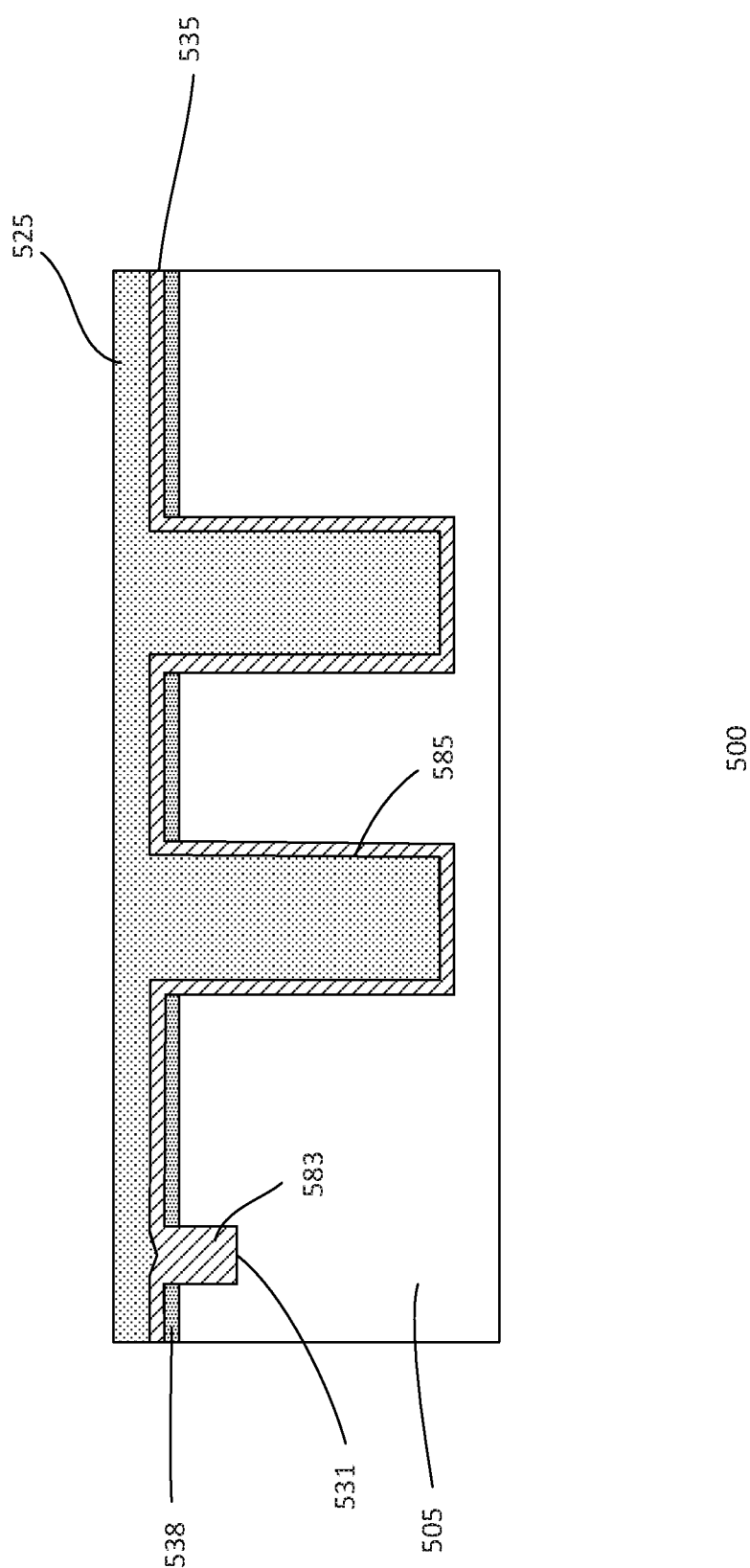

Referring to FIG. 5d, a conductive layer 525 is formed on the substrate, filling the TSV vias and covering the substrate, including the alignment trench. In one embodiment, the conductive layer includes a copper (Cu) or tungsten (W) layer. The conductive layer, for example, is formed by electroplating. Other suitable types of conductive material and techniques for forming the conductive layer may also be useful.

Figure 5E:
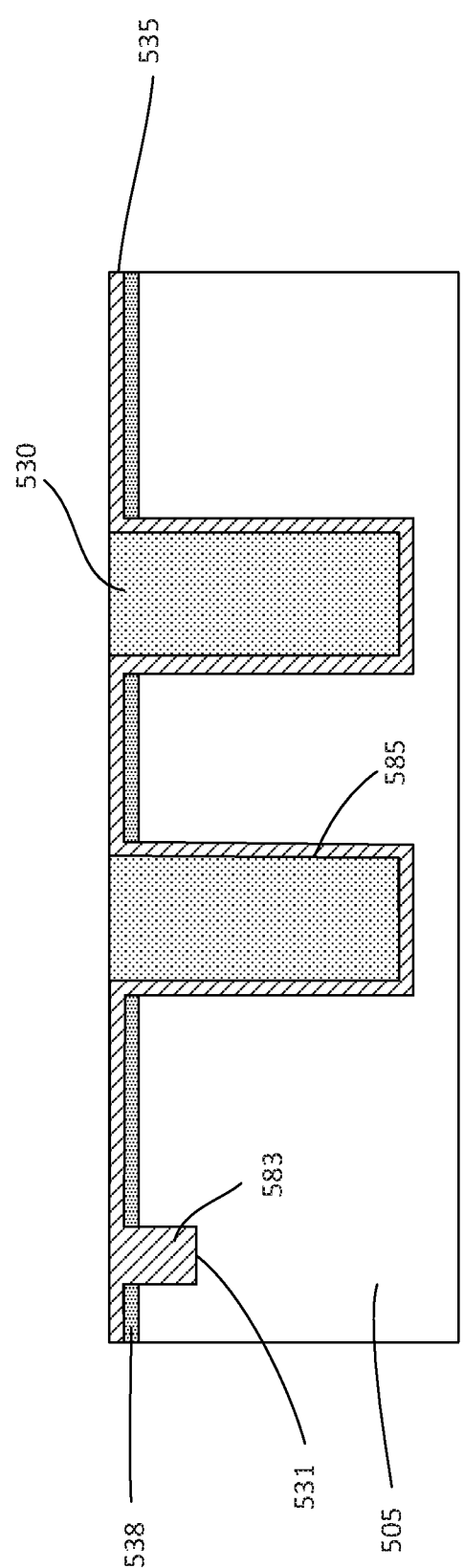

A planarization process is performed on the substrate, as shown in FIG. 5e. The planarization process removes excess conductive layer to form TSV contacts 530. In one embodiment, the planarization process includes chemical mechanical polishing (CMP). Other planarizing processes, including an electroCMP (eCMP) or a combination of planarization processes may also be useful. The CMP removes excess conductive material and produces a planar surface between the conductive material in the TSV vias and dielectric liner layer. The planarization process also produces a planar surface for the dielectric liner material over the alignment trench.

Figure 5F:
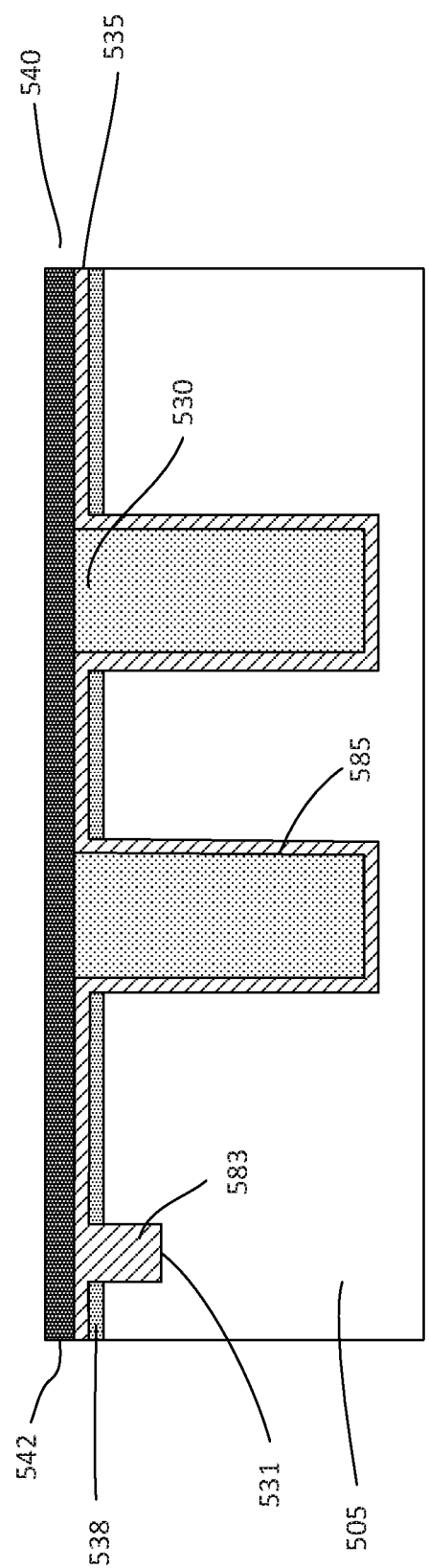

The process continues, for example, to form a RDL on the first surface of the substrate, as shown in FIG. 5f. The process includes forming a bottom RDL level 540. For example, a bottom RDL dielectric layer 542 is formed over the coplanar surfaces of liner and conductive layers. The bottom RDL dielectric layer may be a silicon oxide layer formed by CVD. Other suitable types of dielectric layer or techniques for forming the dielectric layer may also be useful. The bottom RDL layer may be referred to as M1 level.

Figure 5G:
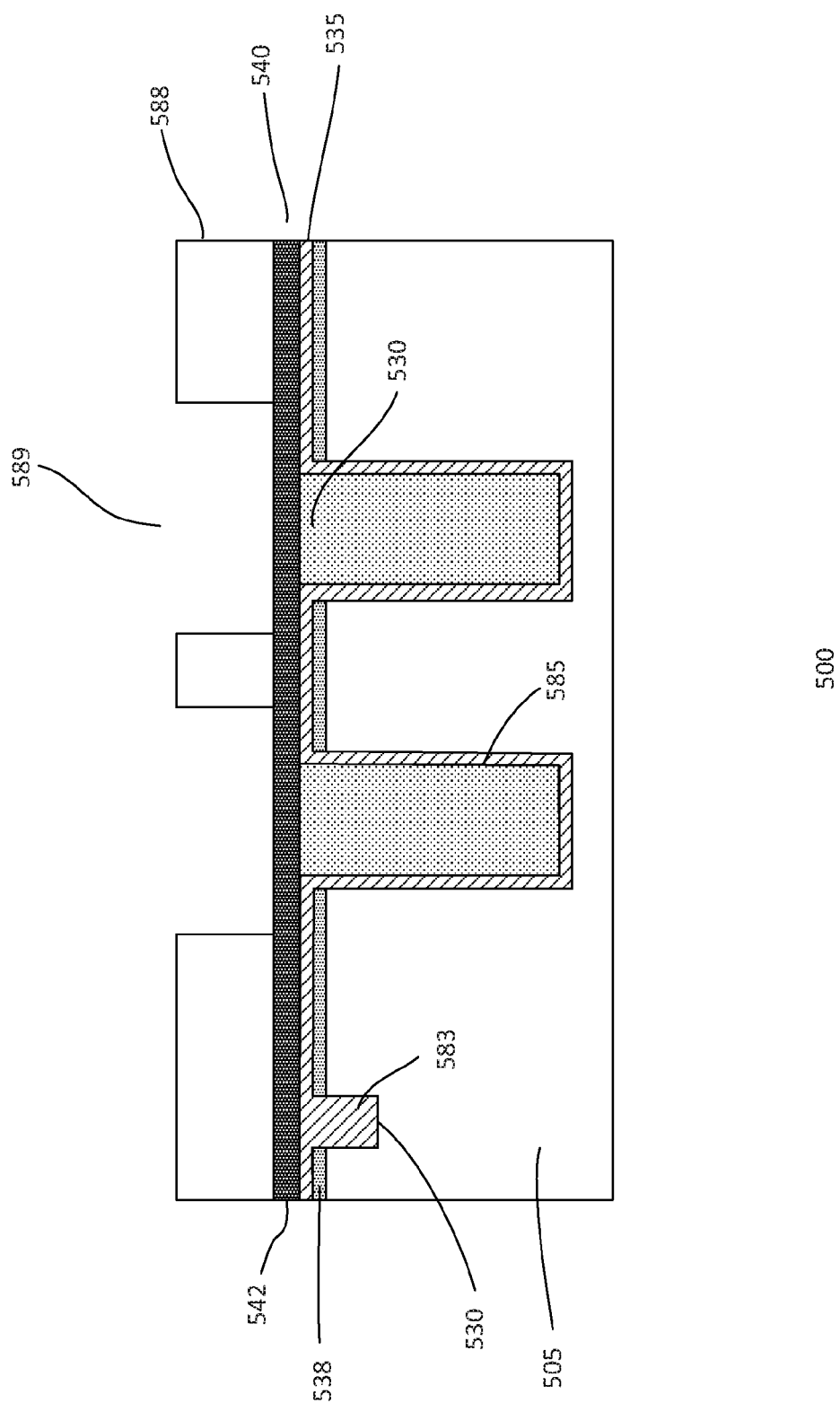

A soft mask layer 588 is formed on the substrate as shown in FIG. 5g. For example, the soft mask layer is formed on the bottom RDL dielectric layer. The soft mask layer, in one embodiment, is a photoresist layer. The soft mask is patterned to form openings 589. The openings correspond to TSV contact pads. The openings, for example, should be sufficient to enable complete exposure of the TSV contacts. To form the openings in the mask layer, it may be selectively exposed with an exposure source using a reticle (not shown). The pattern of the reticle is transferred to the resist layer after exposure by a development process.

In one embodiment, the reticle (not shown) used to expose the resist layer 588 is aligned using the alignment mark 530 on the substrate. For example, the reticle is aligned to the alignment mark filled with dielectric material of the dielectric liner.

An etch is performed on the substrate. The etch, in one embodiment, is an anisotropic etch, such as a RIE, using the patterned resist layer as an etch mask. The etch forms TSV contact pad openings in the bottom RDL dielectric layer, exposing the TSV contacts. A conductive layer is formed on the substrate, filling the contact pad openings. In one embodiment, the conductive layer is a copper layer. The conductive layer, for example, is formed by electroplating. Other suitable types of techniques for forming the conductive layer may also be useful.

Figure 5H:
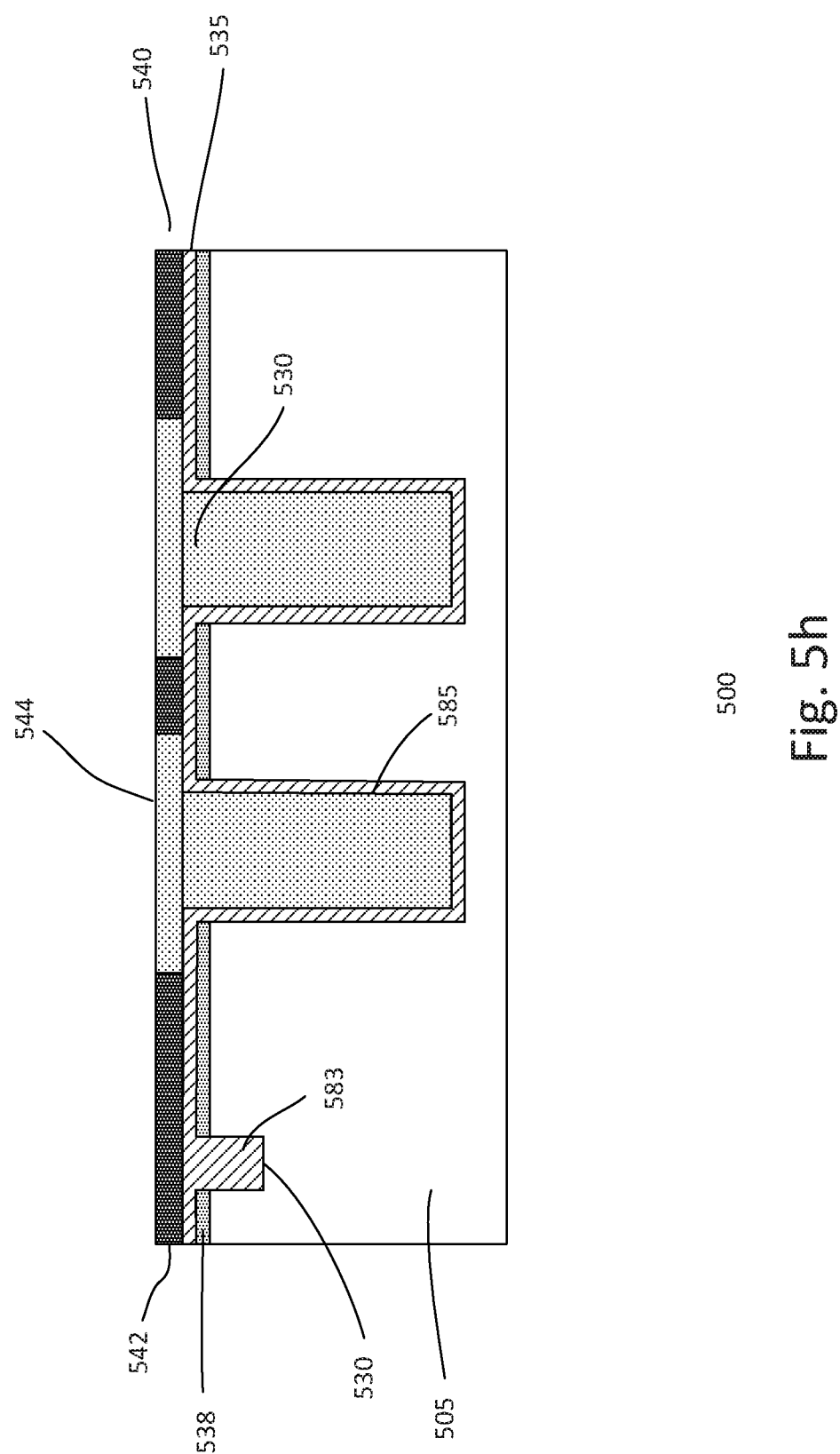

A planarization process is performed on the substrate. The planarization process removes excess conductive layer to form TSV contact pads 544. In one embodiment, the planarization process includes chemical mechanical polishing (CMP). Other suitable planarizing techniques, including an electroCMP (eCMP) or a combination of planarization processes may also be useful. The CMP removes excess conductive material and produces a planar surface between the top surface of the bottom RDL dielectric layer and conductive material in the TSV contact pads. The TSV contact pads may be conductive islands or conductive lines as shown in FIG. 5h.

The process may continue to form upper RDL levels. For example the process continues to form first and second upper RDL layers, as shown and as described in FIG. 4a. A RDL level includes interconnects with contacts in the via level and conductive lines in the line level. The interconnects in the upper RDL levels may be formed using dual damascene techniques. Alignment of subsequent reticles to form the upper RDL levels is based on the previous level.

Above the RDL level is a pad level which includes a pad dielectric layer with pads, such as aluminum or copper pads. Additional processing is performed on the substrate, such as forming dielectric layer and interposer contacts, on the bottom surface of the substrate until a device such as that shown in FIG. 4a is formed. Such processes are performed, for example, using conventional techniques. After processing of the wafer is completed, it is diced to singulate the interposers into individual interposers.

Figure 6A:
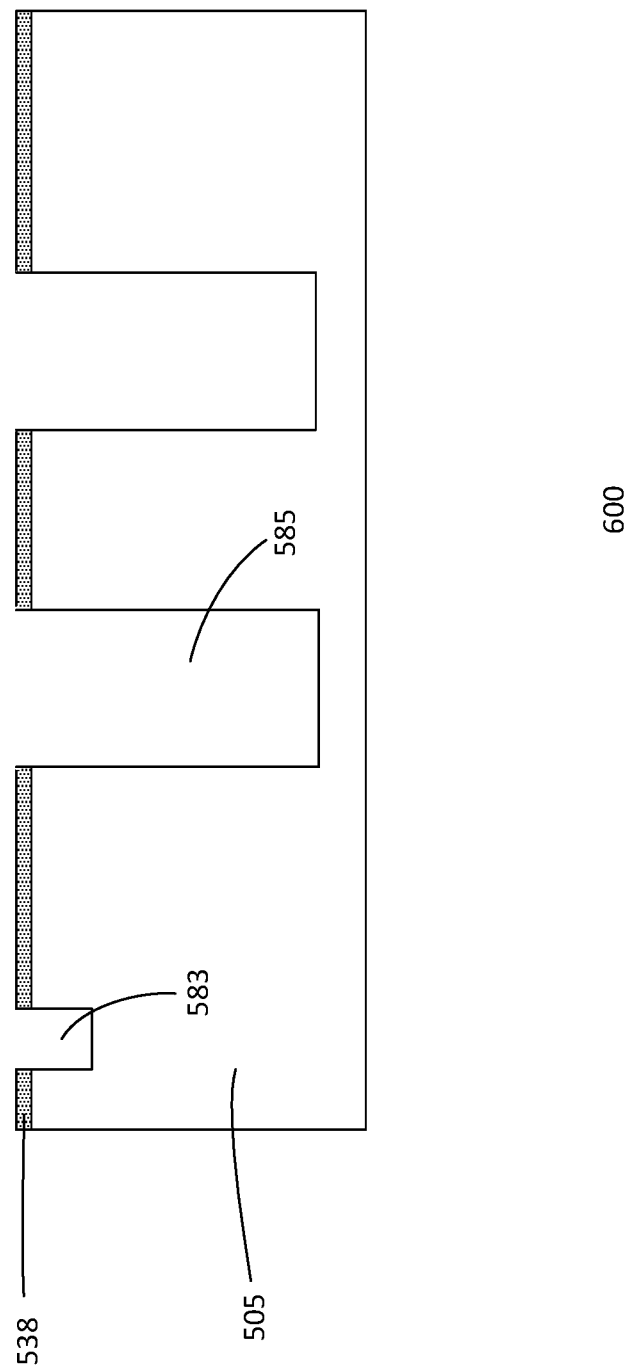
FIGS. 6a-6c show cross-sectional views of another embodiment of a process for forming a device.
Figure 6B:
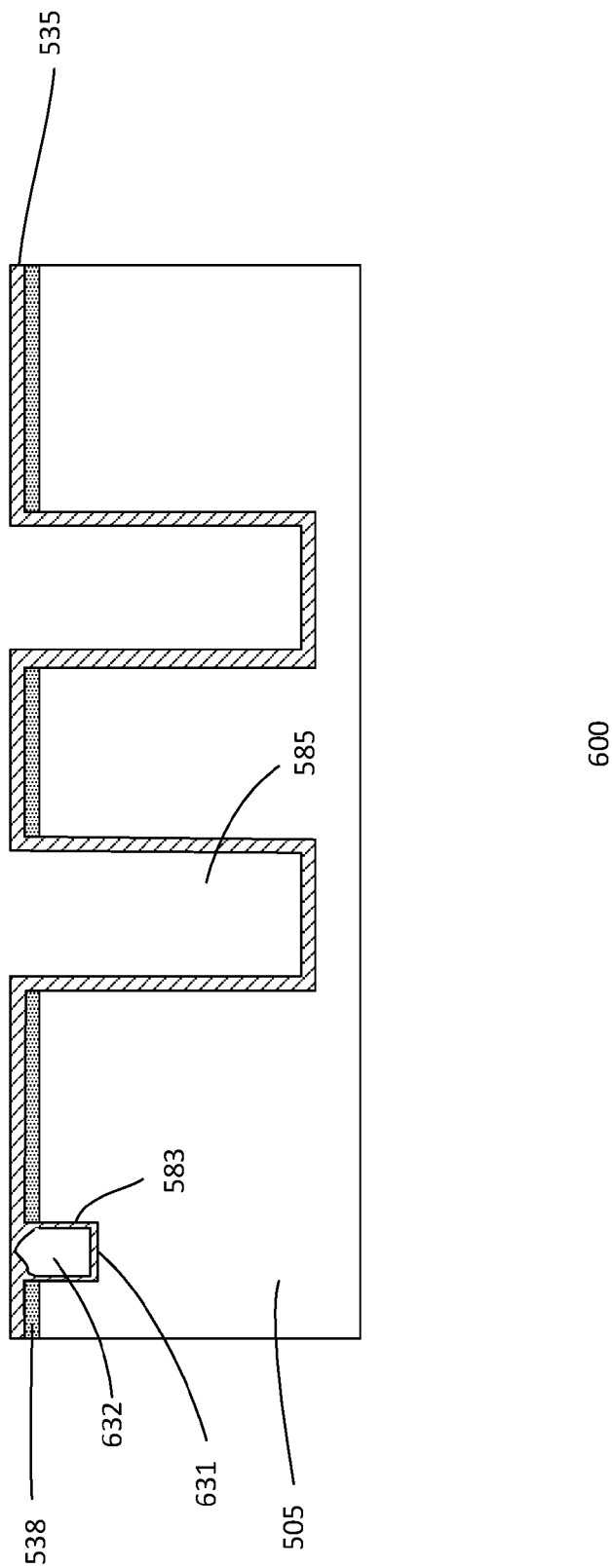
Figure 6C:
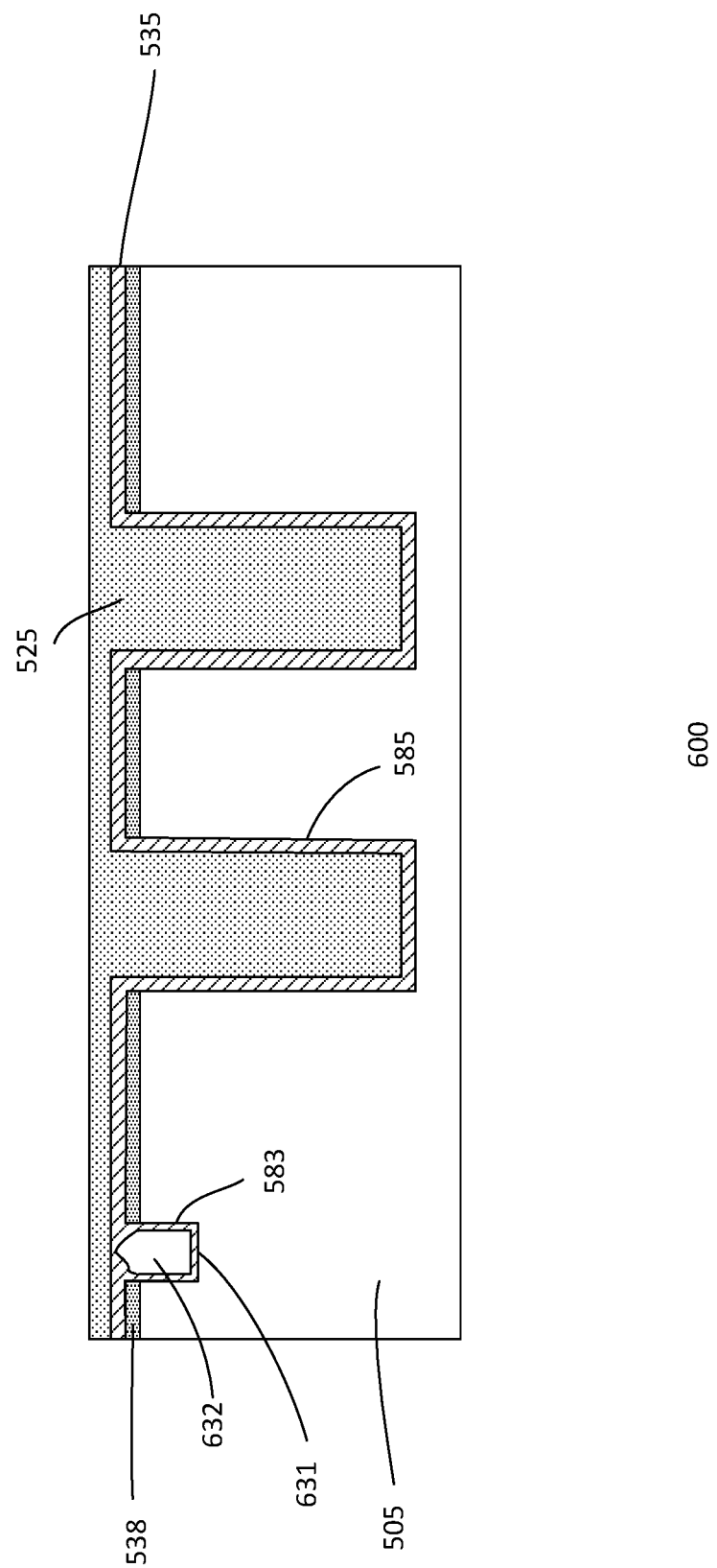

FIGS. 6a-6c show cross-sectional views of another embodiment of a process 600 for forming a device. The process is similar to that described in FIGS. 5a-5h. Common elements may not be described or described in detail. Referring to FIG. 6a, a substrate 505 is provided. The substrate is at the stage of processing as described in FIG. 5b. For example, blind vias or TSV vias 585 and an alignment trench 583 are formed in the substrate by mask and etch technique. The resist mask formed over the hard mask 538 which is used to form the TSV vias and alignment trench is removed.

The process continues to form a dielectric liner 535 on the substrate. The dielectric liner material and the forming technique are the same as that described in FIG. 5c. In one embodiment, the dielectric liner lines the TSV vias and surface of the substrate (hard mask layer) as well as lining the alignment trench to form the alignment mark 631. In one embodiment, the thickness of the liner should be sufficient to provide isolation for the TSV contacts and to pinch-off the alignment trench to form a closed-off void 632, as shown in FIG. 6b.

Referring to FIG. 6c, a conductive layer 525 is formed on the substrate, filling the TSV vias and covering the substrate, including the alignment trench. The conductive layer includes the same material and formed by the same technique as that described in FIG. 5d. As shown, the alignment mark 631 is devoid of conductive material of the conductive layer.

The process continues with processing steps as described in FIG. 5e and onwards. For example, the process continues with planarization process to form the TSV contacts, forming a RDL on the first surface of the substrate, back-grinding the bottom of the substrate to expose bottom of the TSV contacts, etc. Additional processing is performed on the substrate, such as forming interposer dielectric layer and interposer contacts on the bottom surface of the substrate until a device such as that shown in FIG. 4b is formed. Details of these processing steps are the same as that described in FIG. 5e and onwards and therefore will not be described or described in detail.

Figure 7B:
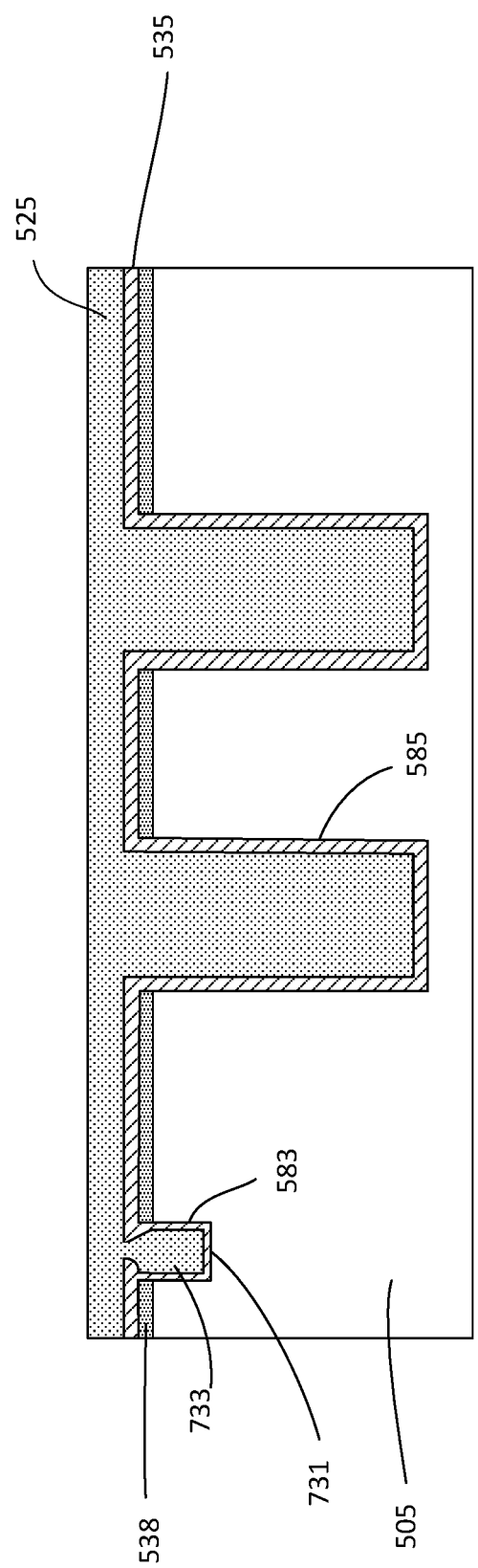

FIGS. 7a-7b show cross-sectional views of another embodiment of a process 700 for forming a device. The process is similar to that described in FIGS. 5a-5h and FIGS. 6a-6c. Common elements may not be described or described in detail. Referring to FIG. 7a, a substrate 505 is provided. The substrate is at the stage of processing as described in FIG. 5b. For example, blind vias or TSV vias 585 and an alignment trench 583 are formed in the substrate by mask and etch technique. The resist mask which is used to form the TSV vias and alignment trench is removed.

The process continues to form a dielectric liner 535 on the substrate. The dielectric liner material and the forming technique are the same as that described in FIG. 5c. In one embodiment, the dielectric liner lines the TSV vias and surface of the substrate (hard mask layer) as well as lining the alignment trench to form the alignment mark 731. In one embodiment, the dielectric liner lines the sidewalls of the alignment trench while leaving a void 733 therein. As shown in FIG. 7a, there is a gap over top portion of the void 733 in the alignment trench which is lined with the dielectric liner.

Referring to FIG. 7b, a conductive layer 525 is formed on the substrate. The conductive layer includes the same material and formed by the same technique as that described in FIG. 5d. In one embodiment, the conductive layer covers the top of the substrate (hard mask layer) and fills the TSV vias and the alignment trench. As shown, due to the presence of the gap over top portion of the void 733, the alignment trench which is lined with the dielectric liner material is at least partially filled with conductive material of the conductive layer 525. In this case, the alignment mark includes conductive material within the dielectric liner material. As shown, the dielectric liner material lining the sidewalls of the alignment trench isolates the conductive material from the substrate material.

The process continues with processing steps as described in FIG. 5e and onwards. For example, the process continues with planarization process to form the TSV contacts, forming a RDL on the first surface of the substrate, back-grinding the bottom of the substrate to expose bottom of the TSV contacts, etc. Additional processing is performed on the substrate, such as forming interposer dielectric layer and interposer contacts on the bottom surface of the substrate until a device such as that shown in FIG. 4c is formed. Details of these processing steps are the same as that described in FIGS. 5e and onwards and therefore will not be described or described in detail.

The embodiments as described above result in advantages. The embodiments as described, for example, enable alignment of RDL conductive traces, such as the TSV contact pads in the form of conductive islands or conductive lines with the underlying TSV contacts without the use of a zero mark layer. This avoids an extra mask layer and removes related process steps which employ the zero mark layer, thereby reducing manufacturing costs. Furthermore, the alignment mark formation as described is formed together or simultaneously with the formation of the TSV contacts and the dielectric or isolation liner of the TSV contacts. Thus, the embodiments as described are simplified processes and are highly compatible and integrated with existing manufacturing process.

In addition, some of the embodiments as described in this disclosure avoid conductive material to be formed inside the alignment trenches. Therefore, reliability issue, such as wafer dicing crack concern caused by copper protrusion in alignment mark formed by conventional process is prevented. For alignment marks which are partially filled with conductive material, the dielectric liner lining sidewalls of the alignment trench sufficiently isolate the conductive material from the substrate. As such, reliability of the device is not compromised. Furthermore, the processes as described are flexible as it allows the alignment mark to be formed in either the frame region or the device region of the substrate. Moreover, the processes as described are suitable to be used in any types of devices which employ TSV techniques.

The embodiments may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:
1. A method for forming a device comprising:
providing a substrate having a top and a bottom surface, wherein the substrate is defined with a device region and a frame region surrounding the device region, wherein the frame region comprises wafer dicing channels;
forming at least one through silicon via (TSV) opening in the substrate, wherein the TSV opening extends through the top and bottom surfaces of the substrate;
forming an alignment trench corresponding to an alignment mark in the substrate, wherein the alignment trench extends from the top surface of the substrate to a depth shallower than a depth of the TSV opening;
providing a dielectric liner over the top surface of the substrate, wherein the dielectric liner is a single continuous dielectric layer which lines sidewalls of the

TSV opening and extends over the substrate to completely cover a bottom and sidewalls of the alignment trench;
providing a conductive layer over the dielectric liner, wherein the conductive layer fills the TSV opening;
processing the conductive layer to form a TSV contact within the TSV opening, wherein a top surface of the TSV contact is coplanar with a top surface of the dielectric liner;
forming a first redistribution layer (RDL) over the dielectric liner and the TSV contact, wherein the first RDL layer comprises a dielectric material and a contact pad opening, wherein the contact pad opening extends through the first RDL layer to completely expose the top surface of the TSV contact, wherein a portion of the first RDL layer overlaps the alignment trench; and
forming a TSV contact pad in the contact pad opening of the first RDL layer, wherein a top surface of the TSV contact pad is coplanar with a top surface of the first RDL layer.

2. The method of claim 1 wherein the TSV opening and the alignment trench are formed simultaneously in the substrate, wherein the TSV opening is formed in the device region and the alignment trench is formed in the frame region.

3. The method of claim 1 wherein the alignment trench comprises a width less than about 2 times the thickness of the dielectric liner which lines the sidewalls of the TSV opening.

4. The method of claim 1 comprising forming the alignment mark in the alignment trench prior to forming the first RDL layer, wherein the alignment mark is devoid of conductive material.

5. The method of claim 1 wherein the dielectric liner completely fills the alignment trench to form the alignment mark.

6. The method of claim 1 wherein the dielectric liner which lines the alignment trench pinches off to form the alignment mark having a closed-off void within the alignment trench.

7. The method of claim 6 wherein the alignment mark is devoid of conductive material.

8. The method of claim 1 wherein a portion of the dielectric liner extends over the alignment trench, wherein the portion of the first RDL layer which overlaps the alignment trench is in contact with the portion of the dielectric liner which extends over the alignment trench.

9. The method of 1 comprising forming a second RDL layer over the first RDL layer, wherein the second RDL layer is processed to form an interconnect structure in the second RDL layer, wherein the interconnect structure comprises a conductive contact and a conductive line.

10. The method of claim 9 wherein the interconnect structure in the second RDL layer is in electrical communication with the TSV contact pad in the first RDL layer, wherein the first and second RDL layers are dielectric layers.

11. A method for forming a device comprising:
providing a substrate having a top and a bottom surface, wherein the substrate is defined with a device region and a frame region surrounding the device region, wherein the frame region comprises wafer dicing channels;
forming a through silicon via (TSV) opening and an alignment trench corresponding to an alignment mark in the substrate, wherein the TSV opening is formed within the device region and the alignment trench is formed within the frame region, wherein the alignment trench extends from the top surface of the substrate to a depth shallower than a depth of the TSV opening;
providing a dielectric liner over the top surface of the substrate, wherein the dielectric liner is a single continuous layer which at least lines sidewalls of the TSV opening and extends over the first surface of the substrate to completely cover a bottom and sidewalls of the alignment trench;
providing a conductive layer over the dielectric liner, wherein the conductive layer fills the TSV opening;
processing the conductive layer to form a TSV contact in the TSV opening, wherein a top surface of the TSV contact is coplanar with a top surface of the dielectric liner;
forming a first redistribution layer (RDL) over the dielectric liner, wherein the first RDL layer comprises a contact pad opening extending through the first RDL layer, wherein the contact pad opening exposes the top surface of the TSV contact, wherein a portion of the first RDL layer completely overlaps the alignment trench; and
forming a TSV contact pad in the contact pad opening of the first RDL layer.

12. The method of claim 11 comprising:
forming a second RDL layer over the first RDL layer, wherein the second RDL layer is processed to form an interconnect structure within the second RDL layer, wherein the interconnect structure in the second RDL layer is in electrical communication with the TSV contact pad in the first RDL layer.

13. The method of claim 12 comprising forming the alignment mark in the alignment trench prior to forming the first RDL layer, wherein the alignment mark is electrically isolated from the TSV contact pad in the first RDL layer and the interconnect structure in the second RDL layer.

14. The method of claim 11 wherein the dielectric liner extends over the alignment trench to form a closed-off void within the alignment trench.

15. The method of claim 11 wherein the dielectric liner lines the bottom and sidewalls of the alignment trench without filling the alignment trench.

16. The method of 15 wherein the conductive layer which fills the TSV opening to form the TSV contact also fills the alignment trench to form the alignment mark, wherein the alignment mark is electrically isolated from the TSV contact and the TSV contact pad.

17. The method of claim 11 comprising forming the alignment mark in the alignment trench prior to forming the first RDL layer, wherein the alignment mark is devoid of conductive material.

18. The method of claim 16 comprising processing the conductive layer to form the alignment mark such that a top surface of the alignment mark is coplanar with the top surface of the dielectric liner and the top surface of the TSV contact.

19. The method of claim 11 wherein a portion of the dielectric liner extends over the alignment trench, wherein the portion of the first RDL layer which overlaps the alignment trench is in contact with the portion of the dielectric liner which extends over the alignment trench.

20. The method of claim 11 comprising forming a hard mask layer on the top surface of the substrate and a soft mask layer on the hard mask layer prior to forming the TSV opening and the alignment trench, wherein the soft mask is patterned to expose a first and a second portion of the hard mask layer, wherein the first exposed portion corresponds with the location of the alignment trench and the second exposed portion corresponds with the location of the TSV opening.

21. The method of claim 20 comprising performing an etch process on the substrate using the patterned soft mask layer as an etch mask, wherein the etch process etches through the first and second exposed hard mask portions and into the substrate to form the TSV opening and the alignment trench.

22. The method of claim 21 comprising removing the patterned soft mask after forming the alignment trench and the TSV opening, wherein the hard mask layer is not removed.

23. The method of claim 22 wherein the dielectric liner is formed over and covers a top surface of remaining portions of the etched hard mask layer.

24. The method of claim 11 wherein the dielectric liner fills the alignment trench to form the alignment mark.

25. A method for forming a device comprising:
provifing a substrate having first and second surfaces, wherein the substrate is defined with a device region and a frame region surrounding the device region;
forming at least one through silicon via (TSV) opening and an alignment trench corresponding to an alignment mark in the substrate, wherein the alignment trench extends from the first surface of the substrate into the substrate to a depth shallower than a depth of the TSV opening;
providing a dielectric liner layer over the substrate, wherein the dielectric liner layer is a continuous layer which extends over the first surface of the substrate and at least lines sidewalls of the TSV opening and sidewalls of the alignment trench, wherein the dielectric liner layer completely fills the alignment trench to form the alignment mark;
providing a conductive layer over the substrate, wherein the conductive layer fills at least the TSV opening to form TSV contact; and
processing the conductive layer to form the TSV contact such that a top surface of the TSV contact is about coplanar with a top surface of the portion of the continuous dielectric liner layer which extends over the first surface of the substrate.

\* \* \* \* \*